United States Patent
Saeki

(10) Patent No.: US 10,135,444 B2
(45) Date of Patent: Nov. 20, 2018

(54) SEMICONDUCTOR DEVICE WITH BOOSTER PART, AND BOOSTER

(71) Applicant: Synaptics Japan GK, Tokyo (JP)

(72) Inventor: Yutaka Saeki, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 0 days.

(21) Appl. No.: 15/333,709

(22) Filed: Oct. 25, 2016

(65) Prior Publication Data

US 2017/0126117 A1    May 4, 2017

(30) Foreign Application Priority Data

Oct. 29, 2015   (JP) .................................. 2015-212616

(51) Int. Cl.
*H02M 3/07* (2006.01)
*H03K 19/0175* (2006.01)
*H03K 19/0185* (2006.01)

(52) U.S. Cl.
CPC .............. *H03K 19/017509* (2013.01); *H03K 19/018507* (2013.01)

(58) Field of Classification Search
CPC ............................................. H02M 2003/078
See application file for complete search history.

(56) References Cited

U.S. PATENT DOCUMENTS

| | | | | |
|---|---|---|---|---|
| 6,456,152 B1* | 9/2002 | Tanaka | ................... | G11C 5/145 327/536 |
| 7,466,188 B2* | 12/2008 | Fifield | ................... | G11C 5/145 327/536 |
| 7,986,131 B2* | 7/2011 | Sugiyama | ............... | H02M 3/07 320/107 |
| 9,225,234 B2* | 12/2015 | Ku | ......................... | H02M 1/36 |
| 2006/0290414 A1* | 12/2006 | Kim | ........................ | H02M 3/07 327/536 |
| 2010/0265241 A1 | 10/2010 | Tahata | | |

* cited by examiner

Primary Examiner — Jeffrey Zweizig
(74) Attorney, Agent, or Firm — Patterson + Sheridan, LLP

(57) ABSTRACT

The booster precharges a boost-voltage-output terminal to a predetermined voltage before voltage-boosting start by a charge-pump circuit in the booster. While alternately switching one capacitive electrode of a pumping capacitance between first and second voltages, the charge-pump circuit periodically applies a third voltage to the other capacitive electrode, in which the voltage is boosted by lifting up the third voltage each switching. The resultant boost voltage is successively supplied to a stabilization capacitance through a MOS switch circuit for output. Thus, a boost voltage boosted to a sum voltage of the second and third voltages can be obtained. Using a precharge voltage produced by the precharge circuit in the booster as the third voltage can make a MOS switch circuit operable to supply the third voltage and the MOS switch circuit for boost voltage output smaller than a voltage under the sum voltage of the second and third voltages.

18 Claims, 7 Drawing Sheets

SEMICONDUCTOR DEVICE WITH BOOSTER PART, AND BOOSTER

CROSS-REFERENCE TO RELATED APPLICATIONS

The Present application claims priority from Japanese application JP 2015-212616 filed on Oct. 29, 2015, the content of which is hereby incorporated by reference into this application.

BACKGROUND

The present invention relates to a semiconductor device with a booster part and a booster. For example, it relates to a technique useful in application to a driver IC (Integrated Circuit) of a display panel.

To raise a voltage of an external power source, a charge-pump circuit may be used. For instance, a liquid crystal driver used to drive a liquid crystal display panel may use a boost voltage to select pixels of the liquid crystal panel by display line. Examples of a literature which describes a charge-pump circuit include the Japanese Unexamined Patent Application Publication No. JP-A-2010-256403.

In the case of materializing a charge-pump circuit by an on-chip circuit of a semiconductor device, externally-mounted elements are used for a stabilization capacitance and a pumping capacitance. A charge-pump circuit alternately switches a capacitive electrode of one of pumping capacitances between first and second voltages and in parallel, periodically applies a third voltage to a capacitive electrode of the other pumping capacitance. The charge-pump circuit lifts up the third voltage thus applied each time the input of the pumping capacitance is switched from the first voltage to the second voltage, thereby successively supplying the resultant boost voltage to a stabilization capacitance through an output MOS (metal-oxide-semiconductor) switch circuit. In this way, a boost voltage resulting from the increase in voltage to a voltage representing the sum of the second voltage and the third voltage can be obtained.

In this charge-pump circuit, a boost voltage is formed on the capacitive electrode of the other pumping capacitance eventually. Therefore, a MOS switch circuit serving to apply the third voltage to the capacitive electrode, and the output MOS switch circuit have a withstand voltage comparable to a voltage representing the sum of the second voltage and the third voltage. That is, for each of such MOS switch circuits, a high-voltage MOS switch circuit larger, in withstand voltage, than a middle-voltage MOS switch circuit serving to alternately apply the first and second voltages before boosting to the one pumping capacitance should be used. A MOS switch element larger in withstand voltage has a larger on-resistance. To reduce the on-resistance, it is necessary to increase the transistor size, thereby widening the width of a gate.

SUMMARY

One embodiment described herein is a semiconductor device that includes a booster part that includes a charge pump part and a precharge circuit. The charge pump part includes a stabilization capacitance connection terminal to which a stabilization capacitance is externally mounted, a pumping capacitance connection terminal to which a pumping capacitance is externally mounted, a first MOS switch circuit operable to alternately supply first and second voltages to one capacitive electrode of the pumping capacitance through the pumping capacitance connection terminal, a second MOS switch circuit operable to periodically supply a third voltage to the other capacitive electrode of the pumping capacitance through the pumping capacitance connection terminal, and a third MOS switch circuit disposed between the second MOS switch circuit and the stabilization capacitance connection terminal, and where the third MOS switch circuit is switched complementarily to the second MOS switch circuit. Further, the precharge part comprises a fourth MOS switch circuit operable to supply the third voltage to the stabilization capacitance connection terminal before a voltage-boosting operation by the charge pump part.

Another embodiment described herein is a semiconductor device that includes a booster part that includes a charge pump part. The charge pump part includes a stabilization capacitance connection terminal to which a stabilization capacitance is externally mounted, a pumping capacitance connection terminal to which a pumping capacitance is externally mounted, a first MOS switch circuit operable to alternately supply first and second voltages to one capacitive electrode of the pumping capacitance through the pumping capacitance connection terminal, a second MOS switch circuit operable to periodically supply a third voltage to the other capacitive electrode of the pumping capacitance through the pumping capacitance connection terminal, and a third MOS switch circuit disposed between the second MOS switch circuit and the stabilization capacitance connection terminal, and where the third MOS switch circuit is switched complementarily to the second MOS switch circuit. The first, second and third MOS switch circuits each have a withstand voltage larger than the third voltage and smaller than a sum of the second and third voltages on the assumption that the function of charging, by a diode, the third voltage to the stabilization capacitance connection terminal is utilized, and the diode comprises a cathode connected to a third voltage-supply terminal for receiving the third voltage from outside the semiconductor device, and an anode connected to the stabilization capacitance connection terminal.

Another embodiment described herein is a booster that includes a charge-pump circuit and precharge circuit. The charge-pump circuit includes a stabilization capacitance, a pumping capacitance, a first MOS switch circuit operable to alternately supply first and second voltages to a first capacitive electrode of the pumping capacitance, a second MOS switch circuit operable to periodically supply a third voltage to a second capacitive electrode of the pumping capacitance, and a third MOS switch circuit disposed between the second MOS switch circuit and the stabilization capacitance, and where the third MOS switch circuit is switched complementarily to the second MOS switch circuit. The precharge circuit includes a fourth MOS switch circuit operable to supply the third voltage to the stabilization capacitance before a voltage-boosting operation by the charge-pump circuit.

Another embodiment described herein is a booster that includes a charge-pump circuit and a precharge circuit. The charge-pump circuit includes a stabilization capacitance, a pumping capacitance, a first MOS switch circuit operable to alternately supply first and second voltages to a first capacitive electrode of the pumping capacitance, a second MOS switch circuit operable to periodically supply a third voltage to a second capacitive electrode of the pumping capacitance, and a third MOS switch circuit disposed between the second MOS switch circuit and the stabilization capacitance, and where the third MOS switch circuit is switched complementarily to the second MOS switch circuit. The precharge circuit includes a diode receiving the third voltage at a cathode and an anode coupled to a connection node of the stabilization capacitance and the third MOS switch circuit. The first, second and third MOS switch circuits each have a withstand voltage larger than the third voltage and smaller than a voltage representing a sum of the second and third voltages.

DETAILED DESCRIPTION

Introduction

Figure 1:
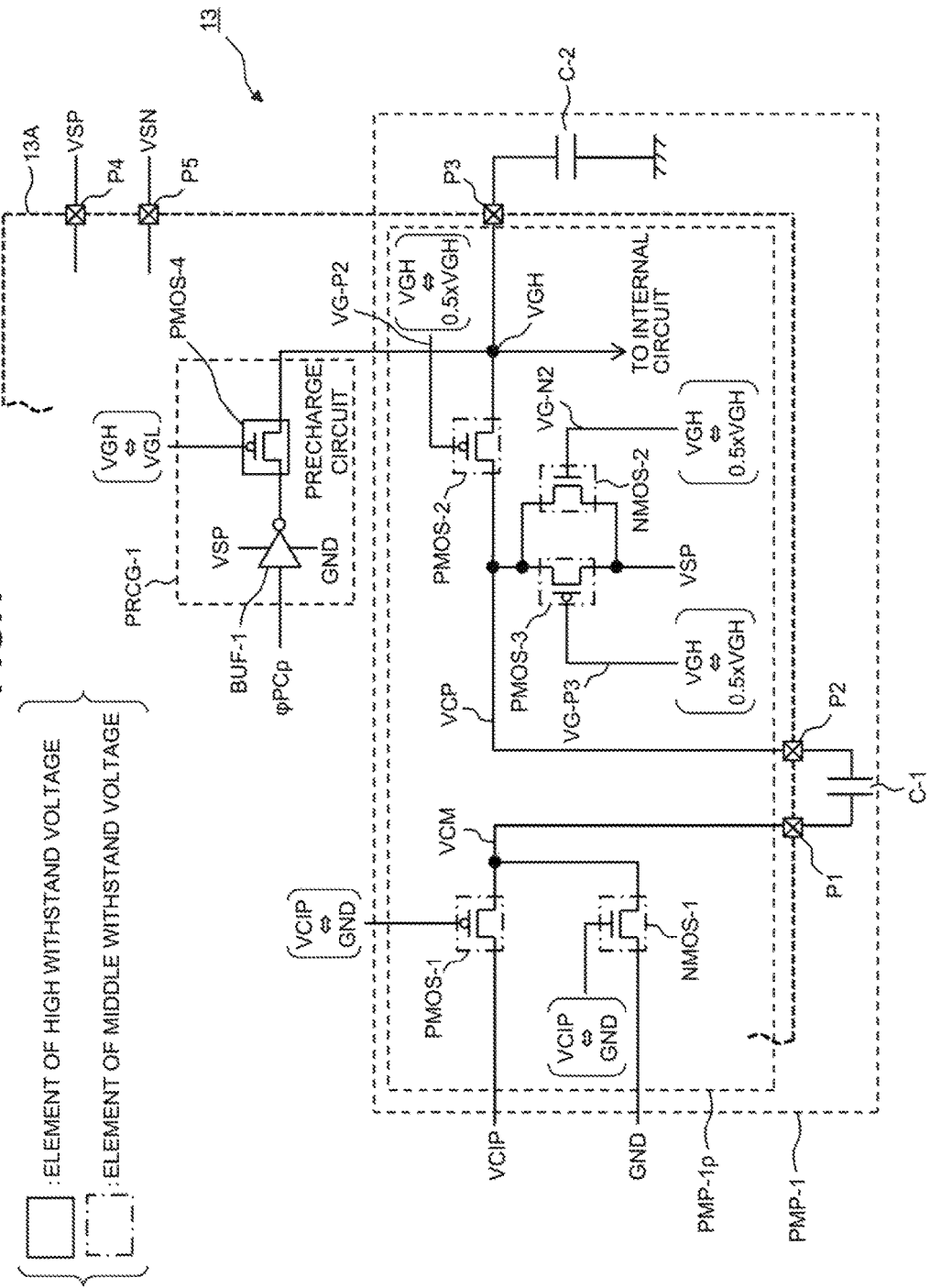
FIG. 1 is a circuit diagram showing a booster according to a first embodiment.

The inventor made a study on the output resistance of a charge-pump circuit. Then, the inventor revealed that there is a problem as follows. In a charge-pump circuit, the operation of boosting a voltage becomes inefficient with a larger output resistance and thus, the power consumption becomes more wasteful. To lower the output resistance of a charge-pump circuit, a transistor size of an output MOS switch circuit as described above can be increased, which leads to an increase in chip size. Especially, the inventor made consideration on a driver IC such as a liquid crystal driver for driving a liquid crystal panel. In view of such a tendency that liquid crystal panels progress toward higher resolution and are often arranged to have a touch detection function in addition, electric current consumed by a liquid crystal driver is increasing, and a power source which can cope with such increasing electric current consumption is desired. And therefore, in order to cope with the increasing electric current consumption, it is desired to have a charge-pump circuit for forming a high-voltage operating power source to expedite a voltage boosting action thereby mitigating the power wasted. For this purpose, the output resistance of a charge-pump circuit mounted on a liquid crystal driver is reduced for enhancement of its driving power. Even so, it is allowed to increase the chip size of a liquid crystal driver. A liquid crystal driver is mounted around a display panel in such a way as to dispose the driver on a frame edge thereof. To avoid increasing the size of a display panel unit, it is desired to avoid increasing the chip size of a liquid crystal driver as long as possible. The circumstances in connection with the output impedance of a charge-pump circuit and the chip footprint are not limited to a liquid crystal driver. They still apply in other driver ICs each including a charge-pump circuit as well.

It is one object of the invention to lower an output impedance of a charge-pump circuit without increasing the size of an output transistor thereof.

The above and other objects of the invention, and novel features thereof will become apparent from the description hereof and the accompanying diagrams.

Of the embodiments herein disclosed, the representative embodiment will be briefly outlined below. Incidentally, reference character strings and others herein noted in parentheses are just examples for easier understanding.

Figure 4:
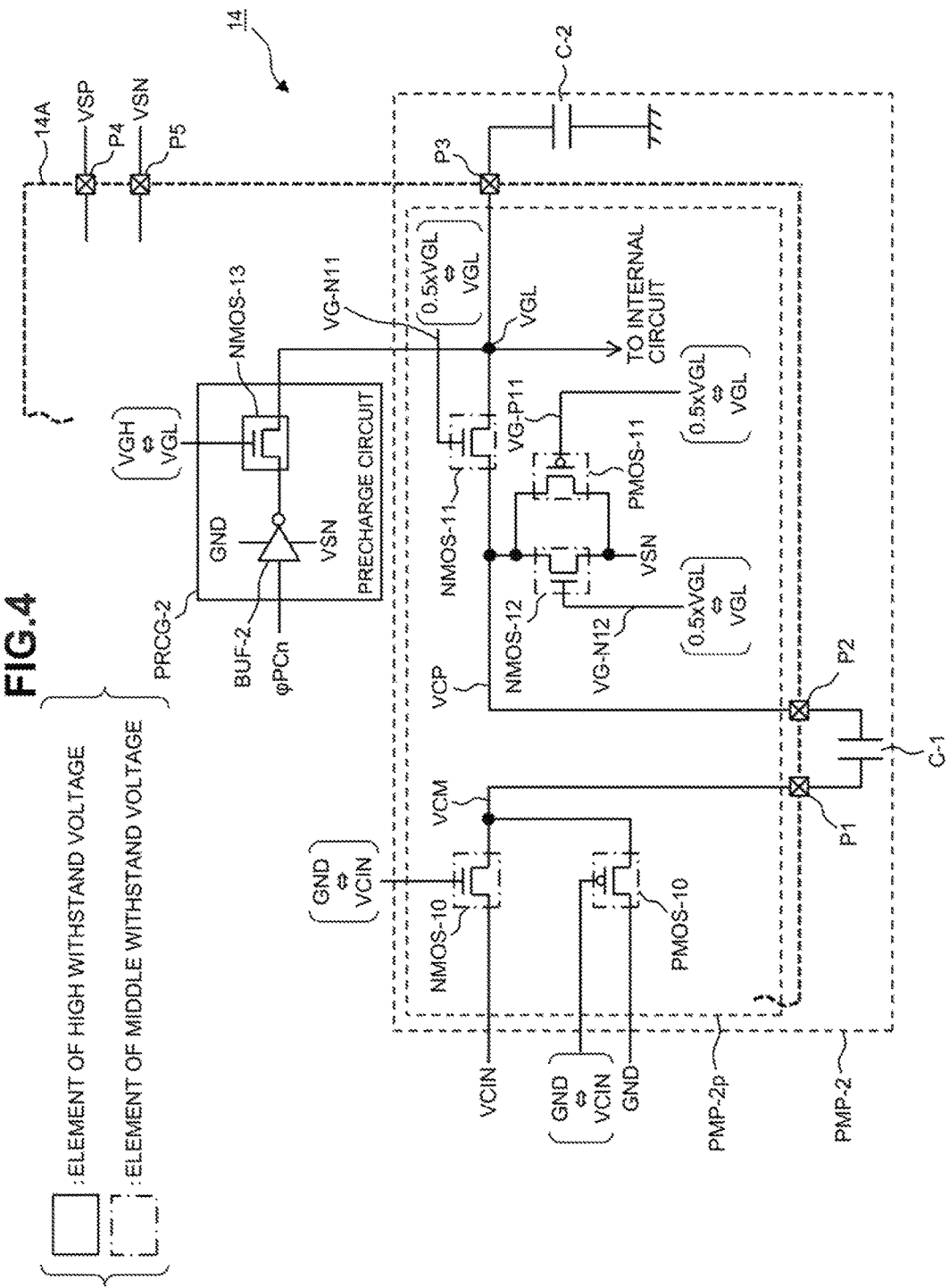
FIG. 4 is a circuit diagram showing a booster according to the second embodiment.
Figure 6:
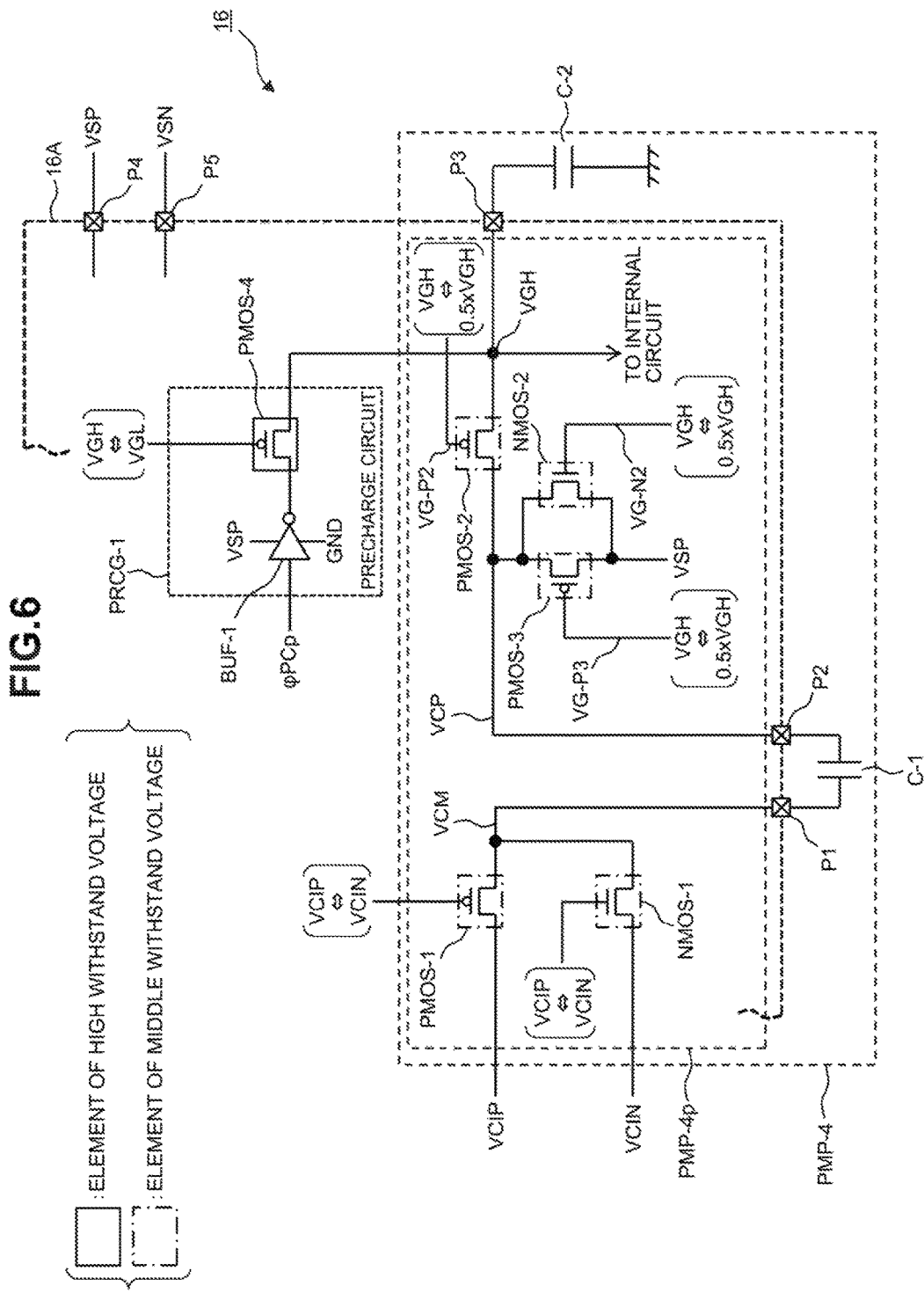
FIG. 6 is a circuit diagram showing a booster according to the fourth embodiment.

[1] Precharge the output node before voltage-boosting start (See FIGS. 1, 4 and 6)

A semiconductor device (3) has a booster part (13A, 14A or 16A). The booster part has a charge pump part (PMP-1$p$, PMP-2$p$ or PMP-4$p$); and a precharge circuit (PRCG-1, PRCG-2 or PRCG-1). The charge pump part includes: a stabilization capacitance connection terminal (P3) to which a stabilization capacitance (C-2) is mounted externally; pumping capacitance connection terminals (P1 and P2) to which a pumping capacitance is mounted externally; a first MOS switch circuit (a combination of PMOS-1 and NMOS-1, a combination of PMOS-10 and NMOS-10, or a combination of PMOS-1 and NMOS-1) which alternately supplies first and second voltages (GND and VCIP, VCIN and GND, or VCIN and VCIP) to one capacitive electrode of the pumping capacitance through the pumping capacitance connection terminal; a second MOS switch circuit (NMOS-2 and PMOS-3, NMOS-12 and PMOS-11, or NMOS-2 and PMOS-3) which periodically supplies a third voltage (VSP, VSN or VSP) to the other capacitive electrode of the pumping capacitance through the pumping capacitance connection terminal; and a third MOS switch circuit (PMOS-2, NMOS-11 or PMOS-2) disposed between the second MOS switch circuit and the stabilization capacitance connection terminal, and switched complementarily to the second MOS switch circuit. The precharge circuit has a fourth MOS switch circuit (PMOS-4, NMOS-13 or PMOS-4) which supplies the third voltage to the stabilization capacitance connection terminal before a voltage-boosting operation by the charge-pump circuit.

According to the embodiment like this, the stabilization capacitance connection terminal serving as a terminal for output of a boost voltage resulting from the boosting by the charge pump part is precharged to the third voltage before the start of a voltage-boosting operation. The charge pump part alternately switches one capacitive electrode of the pumping capacitance between the first and second voltages and in parallel, periodically applies the third voltage to the other capacitive electrode of the pumping capacitance, in which the third voltage is lifted up at each switching for voltage boost, and the resultant boost voltage is successively supplied to the stabilization capacitance through the third MOS switch circuit for output. Thus, the boost voltage boosted to a voltage representing the sum of the second and third voltages can be obtained. By using a precharge voltage produced by the precharge part as the third voltage, the second MOS switch circuit operable to supply the third voltage, and the third MOS switch circuit operable to output the boost voltage can be made a voltage lower than a voltage representing the sum of the second and third voltages. This works so as to reduce the on-resistance of the second MOS switch circuit operable to supply the third voltage, and the third MOS switch circuit for the boost voltage output.

[2] Withstand voltage of MOS switch circuits (See FIGS. 1, 4 and 6)

In the semiconductor device as described in [1], the first, second and third MOS switch circuits each have a withstand voltage larger than the third voltage and smaller than a voltage representing the sum of the second and third voltages.

According to the embodiment like this, a smaller output impedance can be achieved without increasing, in size, the second MOS switch circuit operable to supply the third voltage and the third MOS switch circuit for boost voltage output in comparison to a booster part arranged so that the stabilization capacitance connection terminal is not precharged.

[3] Gating voltage of MOS switch circuits (See FIGS. 1, 4 and 6)

In the semiconductor device as described in [2], gate electrodes of the first MOS switch circuit receive a switch control signal changed between the first and second voltages; and gate electrodes of the second and third MOS switch circuits receive a switch control signal changed between a voltage at a connection node of the stabilization capacitance connection terminal and the third MOS switch circuit, and a voltage of 1/n (n is a natural number of 2 or more) of the voltage at the connection node. The second MOS switch circuit is turned off by the voltage at the connection node, and turned on by the 1/n-voltage. The third MOS switch circuit is turned off by the voltage at the connection node, and turned on by the 1/n-voltage.

According to the embodiment like this, the gate voltages of the second and third MOS switch circuits become those meeting their withstand voltage requirements.

[4] n=2

In the semiconductor device as described in [3], n=2.

According to the embodiment like this, the operations of turning on and off the second and third MOS switch circuits can be performed with reliability by utilizing a boost voltage formed on the stabilization capacitance connection terminal.

[5] Adoption of Ground voltage for the first voltage (See FIGS. 1 and 4)

In the semiconductor device as described in [3], the third voltage is a voltage supplied from outside; the second voltage is a voltage produced based on the third voltage in the semiconductor device; and the first voltage is a ground voltage.

According to the embodiment like this, a boost voltage can be formed on the positive polarity side with respect to the ground voltage in the case of the third voltage having positive polarity, whereas the boost voltage can be formed on the negative polarity-side with respect to the ground voltage in the case of the third voltage having negative polarity. The boost voltage is given by "Third voltage+Second voltage".

[6] Adoption of a voltage differing from the second voltage in polarity for the first voltage (See FIG. 6)

In the semiconductor device as described in [3], the third voltage is a voltage supplied from outside; the second voltage is a voltage produced based on the third voltage in the semiconductor device; and the first voltage is a voltage produced based on a fourth voltage supplied from outside, and differing from the second voltage in polarity.

According to the embodiment like this, the boost voltage is "Third voltage+(Second voltage−First voltage)", and the withstand voltage of the first MOS switch circuit becomes "Second voltage−First voltage". In some cases, the third voltage supplied from a power supply circuit on the system board can be declined by the increase in power consumption by other circuits mounted on the system board. With the arrangement as described in [5], in the event of the undesired decline of the third voltage supplied from outside, the decreases in the third voltage and the second voltage derived therefrom, each making one of elemental voltages forming the boost voltage, account for a larger proportion in the whole boost voltage in combination. In contrast, according to the arrangement as described in [6], in the event of the undesired decline of the third voltage supplied from outside, the decreases in the third voltage and the second voltage derived therefrom, each making one of elemental voltages forming the boost voltage, have influence on the boost voltage, whereas the first voltage makes an elemental voltage having no influence on the decrease in boost voltage and therefore, the influence of the decrease in third voltage on the boost voltage can be eased. In other words, the dependence of the boost voltage on the third voltage can be decreased.

[7] See FIG. 1

In the semiconductor device as described in [5], the second voltage (VCIP) and the third voltage (VSP) are each a positive voltage. The first MOS switch circuit has an n-channel type MOS transistor (NMOS-1) operable to supply the ground voltage (GND) to the one capacitive electrode of the pumping capacitance, and a p-channel type MOS transistor (PMOS-1) operable to supply the second voltage (VCIP) to the one capacitive electrode of the pumping capacitance. The second MOS switch circuit has a p-channel type MOS transistor (PMOS-3) and an n-channel type MOS transistor (NMOS-2) which are connected in parallel with each other and complementarily switched to supply the third voltage (VSP). The third and fourth MOS switch circuits have p-channel type MOS transistors (PMOS-2 and PMOS-4) respectively.

According to the embodiment like this, the boost voltage given by "Second voltage+Third voltage" can be formed on the positive polarity side with respect to the ground voltage.

See FIG. 4

In the semiconductor device as described in [5], the second voltage (VCIN) and the third voltage (VSN) are each a negative voltage. The first MOS switch circuit has a p-channel type MOS transistor (PMOS-10) operable to supply the ground voltage to the one capacitive electrode of the pumping capacitance, and an n-channel type MOS transistor (NMOS-10) operable to supply the second voltage to the one capacitive electrode of the pumping capacitance. The second MOS switch circuit has a p-channel type MOS transistor (PMOS-11) and an n-channel type MOS transistor (NMOS-12) which are connected in parallel with each other and complementarily switched to supply the third voltage. The third and fourth MOS switch circuits have n-channel type MOS transistors (NMOS-11 and NMOS-13) respectively.

According to the embodiment like this, the boost voltage given by "Second voltage+Third voltage" can be formed on the negative polarity side with respect to the ground voltage.

[9] See FIG. 6

In the semiconductor device as described in [5], the first voltage (VCIN) is a negative voltage produced based on a negative voltage (VSN) supplied from outside in the semiconductor device; and the second voltage (VCIP) and the third voltage (VSP) are each a positive voltage. The first MOS switch circuit has an n-channel type MOS transistor (NMOS-1) operable to supply the first voltage to the one capacitive electrode of the pumping capacitance, and a p-channel type MOS transistor (PMOS-1) operable to supply the second voltage to the one capacitive electrode of the pumping capacitance. The second MOS switch circuit has a p-channel type MOS transistor (PMOS-3) and an n-channel type MOS transistor (NMOS-2) connected in parallel with each other and complementarily switched to supply the third voltage. The third and fourth MOS switch circuits have p-channel type MOS transistors (PMOS2 and PMOS4) respectively.

According to the embodiment like this, the boost voltage given by "Third voltage+(Second voltage−First voltage)" can be formed on the positive polarity side with respect to the negative first voltage.

Figure 5:
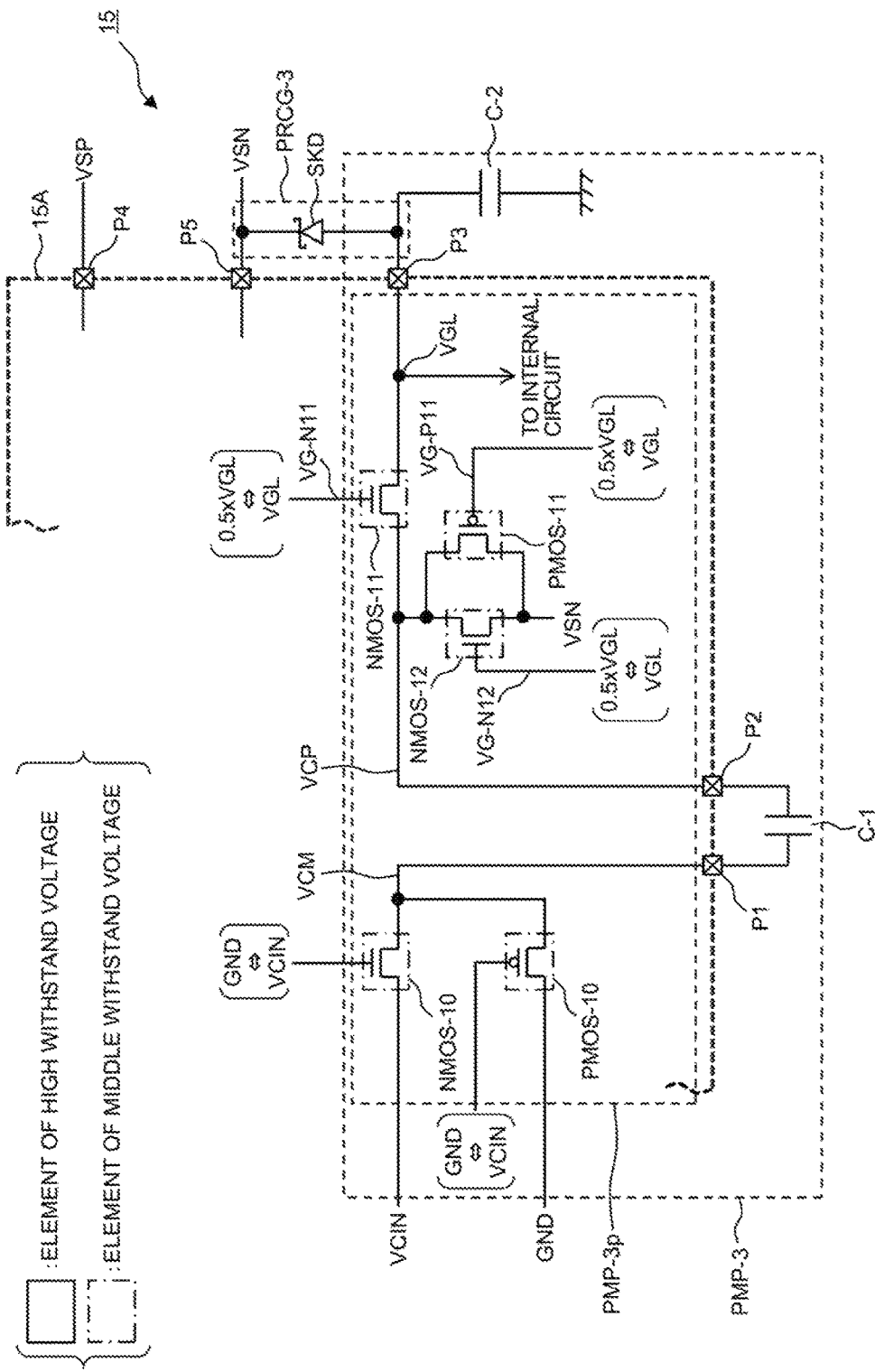
FIG. 5 is a circuit diagram showing a booster according to the third embodiment.

[10] See FIG. 5

A semiconductor device has a booster part (15A). The booster part has a charge pump part (PMP-3p). The charge pump part has: a stabilization capacitance connection terminal (P3) to which a stabilization capacitance is externally mounted; pumping capacitance connection terminals (P1 and P2) to which a pumping capacitance (C-1) is externally mounted; a first MOS switch circuit (PMOS-10 and NMOS-10) operable to alternately supply a first voltage (GND) and a second voltage (VCIN) to one capacitive electrode of the pumping capacitance through the pumping capacitance connection terminal; a second MOS switch circuit (NMOS-12 and PMOS-11) operable to periodically supply a third voltage (VSN) to the other capacitive electrode of the pumping capacitance through the pumping capacitance connection terminal; and a third MOS switch circuit (NMOS-11) disposed between the second MOS switch circuit and the stabilization capacitance connection terminal, and switched complementarily to the second MOS switch circuit. The first, second and third MOS switch circuits each have a withstand voltage larger than the third voltage and smaller than a voltage representing the sum of the second and third voltages on the assumption that the function of charging, by a diode (SKD), the third voltage to the stabilization capacitance connection terminal is utilized, and the diode has a cathode connected to a third voltage-supply terminal (P5) for receiving the third voltage from outside the semiconductor device, and an anode connected to the stabilization capacitance connection terminal.

According to the embodiment like this, the diode externally mounted to the semiconductor device has the function of charging the stabilization capacitance connection terminal to the third voltage. Therefore, even with the semiconductor device having no precharging function, MOS transistors low in withstand voltage can be adopted for the second and third MOS switch circuits, and the same effect and advantage as those of the embodiment as described in [1] can be brought about.

[11] Gate voltage of MOS switch circuits (See FIG. 5)

In the semiconductor device as described in [10], gate electrodes of the first MOS switch circuit receive a switch control signal changed between the first and second voltages. Gate electrodes of the second and third MOS switch circuits receive a switch control signal changed between a voltage at a connection node of the stabilization capacitance connection terminal and the third MOS switch circuit, and a voltage of 1/n (n is a natural number of 2 or more) of the voltage at the connection node. The second MOS switch circuit is turned off by the voltage at the connection node, and turned on by the 1/n-voltage, and the third MOS switch circuit is turned off by the voltage at the connection node, and turned on by the 1/n-voltage.

According to the embodiment like this, the same effect and advantage as those of the embodiment as described in [3] can be brought about.

[12] n=2

In the semiconductor device as described in [11], n=2.

According to the embodiment like this, the same effect and advantage as those of the embodiment as described in [4] can be brought about.

[13] Adoption of Ground voltage for the first voltage (See FIG. 5)

In the semiconductor device as described in [12], the third voltage is a voltage supplied from outside. The second voltage is a voltage produced based on the third voltage in the semiconductor device. The first voltage is a ground voltage.

According to the embodiment like this, the same effect and advantage as those of the embodiment as described in [5] can be brought about.

[14] Adoption of a voltage differing from the second voltage in polarity for the first voltage In the semiconductor device as described in [12], the third voltage is a voltage supplied from outside. The second voltage is a voltage produced based on the third voltage in the semiconductor device. The first voltage is a voltage produced based on a fourth voltage supplied from outside, and differing from the second voltage in polarity.

According to the embodiment like this, the same effect and advantage as those of the embodiment as described in [6] can be brought about.

[15] Precharge the output node before voltage-boosting start (See FIGS. 1, 4 and 6)

A booster (13, 14 or 16) has a charge-pump circuit (PMP-1, PMP-2 or PMP-4) and a precharge circuit (PRCG-1, PRCG-2 or PRCG-1). The charge-pump circuit has: a stabilization capacitance (C-2); a pumping capacitance (C-1); a first MOS switch circuit (a combination of PMOS-1 and NMPS-1, a combination of PMOS-10 and NMOS-10 or a combination of PMOS-1 and NMPS-1) operable to alternately supply first and second voltages (GND and VCIP, VCIN and GND or VCIN and VCIP) to one capacitive electrode of the pumping capacitance; a second MOS switch circuit (a combination of NMOS-2 and PMOS-3, a combination of NMOS-11 and PMOS-12 or a combination of NMOS-2 and PMOS-3) operable to periodically supply a third voltage (VSP, VSN or VSP) to the other capacitive electrode of the pumping capacitance; and a third MOS switch circuit (PMOS-2, NMOS-11 or PMOS-2) disposed between the second MOS switch circuit and the stabilization capacitance, and switched complementarily to the second MOS switch circuit. The precharge circuit has a fourth MOS switch circuit (PMOS-4, NMOS-13 or PMOS-4) operable to supply the third voltage to the stabilization capacitance before a voltage-boosting operation by the charge-pump circuit.

According to the embodiment like this, the same effect and advantage as those of the embodiment as described in [1] can be brought about.

[16] Withstand voltage of MOS switch circuits (See FIGS. 1, 4 and 6)

In the booster as described in [15], the first, second and third MOS switch circuits each have a withstand voltage larger than the third voltage and smaller than a voltage representing the sum of the second and third voltages.

According to the embodiment like this, the same effect and advantage as those of the embodiment as described in [2] can be brought about.

[17] Gate voltage of MOS switch circuits (See FIGS. 1, 4 and 6)

In the booster as described in [16], gate electrodes of the first MOS switch circuit receive a switch control signal changed between the first and second voltages. Gate electrodes of the second and third MOS switch circuits receive a switch control signal changed between a voltage at a connection node of the stabilization capacitance and the third MOS switch circuit, and a voltage of 1/n (n is a natural number of 2 or more) of the voltage at the connection node. The second MOS switch circuit is turned off by the voltage at the connection node, and turned on by the 1/n-voltage. The third MOS switch circuit is turned off by the voltage at the connection node, and turned on by the 1/n-voltage.

According to the embodiment like this, the same effect and advantage as those of the embodiment as described in [3] can be brought about.

[18] See FIG. 5

A booster (15) has: a charge-pump circuit (PMP-3$p$); and a precharge circuit (PRCG-3). The charge-pump circuit has: a stabilization capacitance (C-2); a pumping capacitance (C-12); a first MOS switch circuit (PMOS-10 and NMOS-10) operable to alternately supply a first voltage (GND) and a second voltage (VCIN) to one capacitive electrode of the pumping capacitance; a second MOS switch circuit (NMOS-12 and PMOS-11) operable to periodically supply a third voltage (VSN) to the other capacitive electrode of the pumping capacitance; and a third MOS switch circuit (NMOS-11) disposed between the second MOS switch circuit and the stabilization capacitance, and switched complementarily to the second MOS switch circuit. The precharge circuit has a diode (SKD) receiving the third voltage at a cathode and having an anode coupled to a connection node of the stabilization capacitance and the third MOS switch circuit. The first, second and third MOS switch circuits each have a withstand voltage larger than the third voltage and smaller than a voltage representing the sum of the second and third voltages.

According to the embodiment like this, the same effect and advantage as those of the embodiment as described in [10] can be brought about.

[19] Gate voltage of MOS switch circuits (See FIG. 5)

In the booster as described in [18], gate electrodes of the first MOS switch circuit receive a switch control signal changed between the first and second voltages. Gate electrodes of the second and third MOS switch circuits receive a switch control signal changed between a voltage at a connection node of the stabilization capacitance and the third MOS switch circuit, and a voltage of 1/n (n is a natural number of 2 or more) of the voltage at the connection node. The second MOS switch circuit is turned off by the voltage at the connection node, and turned on by the 1/n-voltage. The third MOS switch circuit is turned off by the voltage at the connection node, and turned on by the 1/n-voltage.

According to the embodiment like this, the same effect and advantage as those of the embodiment as described in [11] can be brought about.

The effect achieved by the representative one of the embodiments herein disclosed is briefly described below.

The output impedance of a charge-pump circuit can be lowered without increasing the size of the output transistor thereof.

Description

FIG. 1 shows a booster according to the first embodiment. The booster 13 shown in the diagram is configured by a booster part 13A arranged in a semiconductor integrated circuit such as a driver IC in an on-chip manner. Although no special restriction is intended, the semiconductor integrated circuit is formed on a semiconductor substrate (semiconductor chip) of monocrystalline silicon or the like by e.g. a known CMOS integrated circuit manufacturing technique.

The booster 13 includes a charge-pump circuit PMP-1 and a precharge circuit PRCG-1. The charge-pump circuit PMP-1 includes a charge pump part PMP-1$p$ arranged in the semiconductor integrated circuit in the on-chip manner, and as externally-mounted elements for the semiconductor integrated circuit, a pumping capacitance C-1 and a stabilization capacitance C-2.

For connection of externally-mounted elements, the charge pump part PMP-1$p$ has a stabilization capacitance connection terminal P3 to which the stabilization capacitance C-2 is externally mounted, and pumping capacitance connection terminals P1 and P2 to which the pumping capacitance C-1 is mounted from outside. Further, an external power source terminal P4 to which an external voltage VSP (e.g. 5V) of positive polarity is supplied, and an external power source terminal P5 to which an external voltage VSN (e.g. −5V) of negative polarity is supplied are disposed as external power source input terminals in the charge pump part. Although not shown in the diagram, the semiconductor integrated circuit has e.g. an external power source terminal for a source voltage (e.g. 3V) for logic circuits as well.

To the pumping capacitance C-1 externally mounted to the pumping capacitance connection terminals P1 and P2, e.g. a p-channel type MOS transistor PMOS-1 and an n-channel type MOS transistor NMOPS-1 are arranged in parallel, serving as a first MOS switch circuit for alternately supplying a ground voltage GND and an internal voltage VCIP of positive polarity to one capacitive electrode of the pumping capacitance; the ground voltage is an example of the first voltage, and the positive internal voltage is an example of the second voltage.

To the other capacitive electrode of the pumping capacitance, e.g. an n-channel type MOS transistor NMOS-2 and a p-channel type MOS transistor PMOS-3 are arranged in parallel, serving as a second MOS switch circuit for periodically supplying an external voltage VSP of positive polarity, which is an example of a third voltage, in a voltage-boosting operation period. Between the connection node of the MOS transistor PMOS-3 and NMOS-2, and the stabilization capacitance connection terminal P3, a p-channel type MOS transistor PMOS-2 is provided as a third MOS switch circuit of which the switching operation is performed complementarily to the MOS transistors PMOS-3 and NMOS-2 in each voltage-boosting operation period.

The precharge circuit PRCG-1 has: a buffer amplifier BUF-1 using, as its operation voltage, a combination of the external voltage VSP as one example of the third voltage, and the ground voltage; and a p-channel type MOS transistor PMOS-4 as a fourth MOS switch circuit operable to supply its output to the stabilization capacitance connection terminal P3 before the voltage-boosting operation by the charge-pump circuit. The buffer amplifier BUF-1 inverts and outputs a precharge-control signal ϕPCp. The precharge is directed by a low level of the precharge-control signal ϕPCp; in the period of the low level, the stabilization capacitance C-2 is precharged by the external voltage VSP output from the buffer amplifier BUF-1 through the MOS transistor PMOS-4.

The internal voltage VCIP is a voltage produced by the external voltage VSP and the ground voltage GND in a regulator (not shown), which satisfies the following condition: GND≤VCIP≤VSP. In the voltage-boosting operation, the one capacitive electrode of the pumping capacitance C-1 is alternately switched between the ground voltage GND and the internal voltage VCIP, whereby the external voltage VSP periodically provided to the other capacitive electrode of the pumping capacitance C-1 is lifted up by the internal voltage VCIP, leading to the voltage boost. The voltage of the one capacitive electrode of the pumping capacitance C-1 is represented by VCM, and the voltage of the other capacitive electrode of the pumping capacitance C-1 is represented by VCP. The boost voltage VGH is a voltage representing the sum of the internal voltage VCIP and the external voltage VSP. The maximum of the internal voltage VCIP is equal to the external voltage VSP and therefore, the boost voltage VGH is double the external voltage VSP at maximum. In this embodiment, the stabilization capacitance connection terminal P3 is precharged by the precharge circuit PRCG-1 to the external voltage VSP before the start of precharge; the boost voltage VGH, ranging up to double the external voltage VSP with respect to the voltage of the stabilization capacitance connection terminal is formed. In the process of the voltage-boosting operation, the gate voltages of the MOS transistors PMOS-2, NMOS-2 and PMOS-3 are changed between the boost voltage VGH and one half thereof, namely the voltage VGH/2 in order to keep the potential differences between the drain and source, between the gate and source, and between the gate and drain in each of the MOS transistors PMOS-2, NMOS-2 and PMOS-3 from exceeding the external voltage VSP even at maximum. According to this arrangement, the withstand voltages of the MOS transistors PMOS-2, NMOS-2 and PMOS-3 may be the same as the withstand voltages (middle withstand voltage) of the MOS transistors PMOS-1 and NMOS-1; and MOS transistors higher in withstand voltage need not be used. The low level of the gate voltages of the MOS transistors PMOS-2, NMOS-2 and PMOS-3 is not limited to the voltage VGH/2, i.e. one half of the boost voltage VGH. It may be smaller than one half of the boost voltage VGH on condition that the MOS transistors PMOS-1 and NMOS-1 still have a relatively large margin in withstand voltage with respect to the external voltage VSP. Further, it may be larger than one half of the boost voltage VGH on condition that the difference in gate voltage between ON and OFF states in each of the MOS transistors PMOS-2, NMOS-2 and PMOS-3 is small.

More specifically, gate-control signals alternately clock-changed between the internal voltage VCIP and the ground voltage GND are supplied to the gates of the MOS transistors PMOS-1 and NMOS-1 in a voltage-boosting operation period. The MOS transistors PMOS-1 and NMOS-1 each have a withstand voltage (middle withstand voltage) enough to withstand the external voltage VSP. To the gates of the MOS transistors PMOS-3 and NMOS-2, gate-control signals VG-P3 and VG-N2 changed between the boost voltage VGH and one half thereof, i.e. the voltage VGH/2 are provided. The gate of the MOS transistor PMOS-2 is provided with a gate-control signal VG-P2 changed between the boost voltage VGH and one half thereof, i.e. the voltage VGH/2.

A voltage at least double as large as the external voltage VSP is applied between terminals of the MOS transistor PMOS-4 of the precharge circuit PRCG-1 and therefore, a high-voltage MOS transistor larger, in withstand voltage, than the middle-voltage MOS transistors of the charge-pump circuit PMP-1 including the MOS transistor PMOS-2 is adopted therefor. Although no special restriction is intended, the positive boost voltage VGH is supplied to the gate of the MOS transistor PMOS-4 in this embodiment. The negative boost voltage VGL is a voltage formed by voltage boosting to be double the negative external voltage VSN at maximum.

Figure 2:
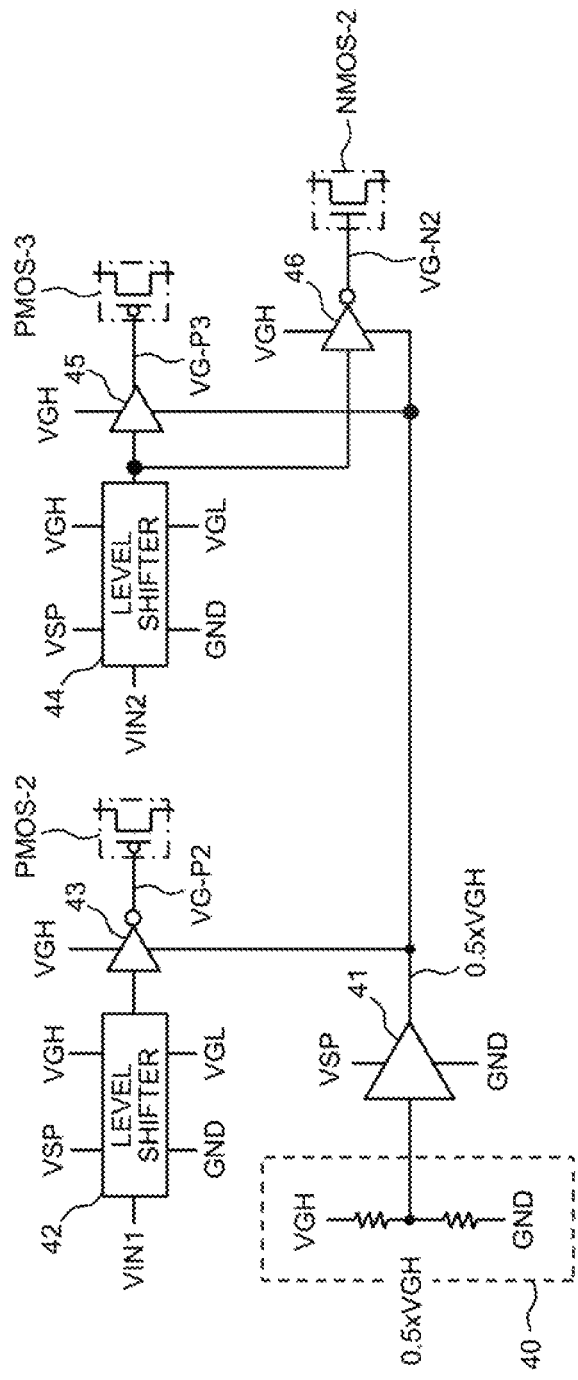
FIG. 2 is a circuit diagram showing a signal-producing logic for main switch control signals of the booster.

FIG. 2 shows, by example, a logic for producing gate-control signals VG-P2, VG-P3 and VG-N2. A resistive potential dividing circuit 40 with a resistance division ratio of ½ halves the boost voltage VGH and then, a buffer amplifier 41 arranged to use a combination of the ground voltage GND and the external voltage VSP as its power source accepts the resultant division voltage to produce the voltage VGH/2 which is one half of the boost voltage VGH.

The gate-control signal VG-P2 is produced by an inverter buffer 43 arranged to use a combination of the boost voltage VGH and one half thereof, i.e. the voltage VGH/2 as its power source, and a level shifter 42. Ina voltage-boosting operation period, the level shifter 42 accepts the input of a clock-changed timing signal VIN1, level-shifts an input amplitude between the ground voltage GND and the external voltage VSP into a signal amplitude between the positive boost voltage VGH and the negative boost voltage VGL, and outputs the resultant signal; the inverter buffer 43 outputs the gate-control signal VG-P2 between the boost voltage VGH and one half thereof, i.e. the voltage VGH/2 according to an output from the level shifter 42.

The gate-control signals VG-P3 and VG-N2 are produced by the inverter buffer 46 arranged to use the boost voltage VGH and one half thereof, i.e. the voltage VGH/2 as its power source, the buffer 45 arranged to use the boost voltage VGH and one half thereof, i.e. the voltage VGH/2 as its power source, and the level shifter 44. In a voltage-boosting operation period, the level shifter 44 accepts the input of a clock-changed timing signal VIN2, level-shifts an input amplitude between the ground voltage GND and the external voltage VSP into a signal amplitude between the positive boost voltage VGH and the negative boost voltage VGL, and outputs the resultant signal. The inverter buffer 46 outputs a gate-control signal VG-N2 between the boost voltage VGH and one half thereof, i.e. the voltage VGH/2 according to an output from the level shifter 44. The buffer 45 outputs the gate-control signal VG-P3 between the boost voltage VGH and one half thereof, i.e. the voltage VGH/2 according to an output from the level shifter 44.

Figure 3:
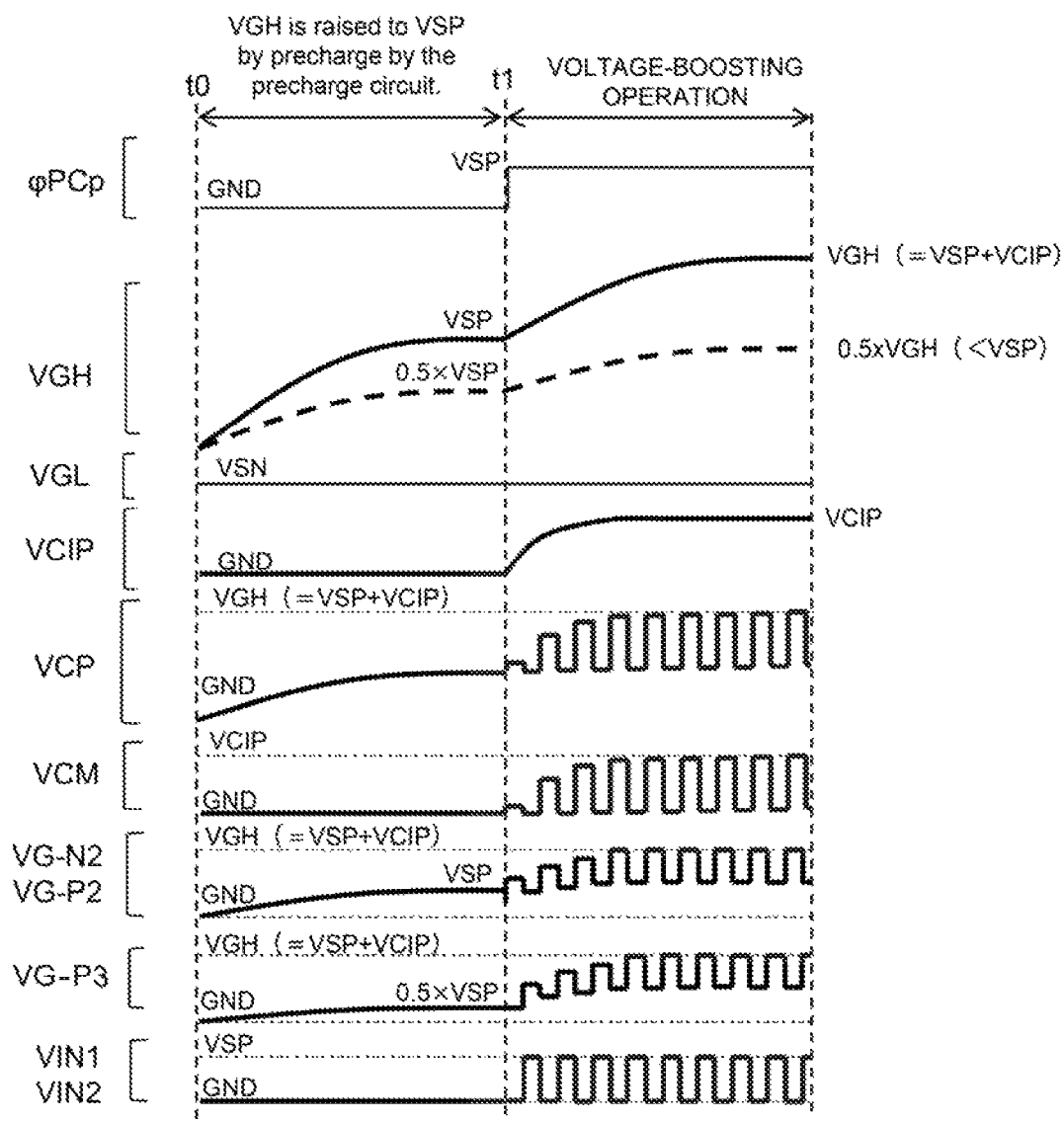
FIG. 3 is an operational waveform diagram showing, by example, the timing of a voltage-boosting operation by the booster of FIG. 1.

FIG. 3 shows operational waveforms for showing, by example, the timing of a voltage-boosting operation by the booster 13 of FIG. 1. Although no special restriction is intended, the power-on reset is performed at the time t0, and the operation of boosting the boost voltage VGH is started at the time t1. Although no special restriction is intended, this embodiment is based on the assumption that the boost voltage VGL has been precharged to the external voltage VSN. In the diagram, ϕPCp represents a precharge signal. Although no special restriction is intended, the precharge signal remains at the ground voltage GND until the start of the voltage-boosting operation, and it turned to the external voltage VSP on the start of the voltage-boosting operation. On power-on reset, the supply of the external voltage VSP to the stabilization capacitance C-2 through the MOS transistor PMOS-4 is started. The boost voltage VGH is raised to the level of the external voltage VSP. In a precharge period from the time t0 to t1, the timing signals VIN1 and VIN2 are fixed to the ground voltage GND. At the time t1, the gate-control signals VG-N2 and VG-P2 become the level of the external voltage VSP, and the gate-control signal VG-P3 becomes the level VSP/2, which is one half of the external voltage VSP. Thus, the internal node voltage VCP becomes the level of the external voltage VSP as well.

After the start of clock change of the timing signal VIN1 and VIN2 at the time t1, the MOS transistors NMOS-1 and PMOS-1 receiving clock signals of an opposite phase thereof are subjected to a complementary switching operation. The change in which the internal node voltage VCM is alternately changed to the internal voltage VCIP and the ground voltage GND while following a change in internal voltage VCIP is transmitted to the internal node voltage VCP through the pumping capacitance C-1. Thus, the internal node voltage VCP is caused to gradually transition to a voltage given by VSP+VCIP while following the change in internal voltage VCIP with respect to the external voltage VSP. The change is supplied to the stabilization capacitance C-2 through the MOS transistor PMOS-2, and the stabilization capacitance is charged. Then, the boost voltage VGH reaches the voltage VSP+VCIP. The boost voltage VGH is supplied to the internal circuit and utilized for an operating power source of a drive circuit and other uses. Although in the waveform diagram of FIG. 3, the voltage-boosting operation is shown as if it is interrupted in the middle thereof, the operation is continued to maintain the boost voltage in fact. It is possible to intermittently make a pause of the voltage-boosting operation within a range which never causes the boost voltage VGH to lower undesirably from the viewpoint of low power consumption.

As described above, the boost voltage VGH is charged to the level of the external voltage VSP by the precharge circuit PRCG-1 before the voltage-boosting operation. Then, the boost voltage is made a voltage over the external voltage VSP by the subsequent voltage-boosting operation, and the gate control of the MOS transistors PMOS-2, PMPS-3 and NMOS-2 is performed with a voltage between the boost voltage VGH and one half thereof, i.e. the voltage VGH/2. The internal voltage VCIP is a voltage produced from the external voltage VSP, which is given by VGH=VSP+VCIP (0≤VCIP≤VSP). Therefore, the inter-terminal voltage differences of the MOS transistors PMOS-2, PMOS-3 and NMOS-2 never exceed the external voltage VSP. Hence, the MOS transistors PMPS-2, PMOS-3 and NMOS-2 may be composed of MOS transistors of middle withstand voltages. While high-voltage elements are used in the precharge circuit PRCG-1 and the control logic of FIG. 2, these elements are not involved in the output impedance of the boost voltage VGH. In other words, a low impedance as required of the MOS transistors PMOS-2, PMOS-3 and NMOS-2 is not required. Therefore, the elements may be composed of elements smaller, in transistor size, than the MOS transistors PMOS-2, PMOS-3 and NMOS-2. According to this, the MOS transistors PMOS-2, PMOS-3 and NMOS-2 constituting parts of the voltage-boosting MOS switch circuit can be composed of MOS transistors of middle withstand voltages; the boost voltage VGH can be raised to double the external voltage VSP at maximum; and both of the decrease in the output resistance of the boost voltage and the reduction in booster size can be achieved.

FIG. 4 shows a booster according to the second embodiment. The booster 14 shown in the diagram is arranged to be able to form a negative boost voltage, which is different from the booster 13 of FIG. 1 and the control logic of FIG. 2 in that the transistor conductivity types and voltage polarities are inverted. The booster 14 is configured by a booster part 14A arranged in a semiconductor integrated circuit such as a driver IC in an on-chip manner. Although no special restriction is intended, the semiconductor integrated circuit is formed on a semiconductor substrate (semiconductor chip) of monocrystalline silicon or the like by e.g. a known CMOS integrated circuit manufacturing technique.

The booster 14 includes a charge-pump circuit PMP-2 and a precharge circuit PRCG-2. The charge-pump circuit PMP-2 includes a charge pump part PMP-2p arranged in the semiconductor integrated circuit in the on-chip manner, and as externally-mounted elements for the semiconductor integrated circuit, a pumping capacitance C-1 and a stabilization capacitance C-2.

For connection of externally-mounted elements, the charge pump part PMP-2p has a stabilization capacitance connection terminal P3 to which the stabilization capacitance C-2 is mounted from outside, and pumping capacitance connection terminals P1 and P2 to which the pumping capacitance C-1 is mounted from outside. Further, an external power source terminal P4 to which an external voltage VSP (e.g. 5V) of positive polarity is supplied, and an external power source terminal P5 to which an external voltage VSN (e.g. −5V) of negative polarity is supplied are disposed as external power source input terminals in the charge pump part. Although not shown in the diagram, the semiconductor integrated circuit includes an external power source terminal of a source voltage (e.g. 3V) for a logic circuit.

To the pumping capacitance C-1 externally mounted to the pumping capacitance connection terminals P1 and P2, e.g. a p-channel type MOS transistor PMOS-10 and an n-channel type MOS transistor NMOPS-10 are arranged in parallel, serving a first MOS switch circuit for alternately supplying the ground voltage GND and an internal voltage VCIN of negative polarity to one capacitive electrode of the pumping capacitance; the ground voltage is an example of the first voltage, and the negative internal voltage is an example of the second voltage.

To the other capacitive electrode of the pumping capacitance, e.g. an n-channel type MOS transistor NMOS-12 and a p-channel type MOS transistor PMOS-11 are arranged in parallel, serving as a second MOS switch circuit for periodically supplying an external voltage VSN of negative polarity, which is an example of the third voltage, in a voltage-boosting operation period.

Between the connection node of the MOS transistors PMOS-11 and NMOS-12, and the stabilization capacitance connection terminal P3, an n-channel type MOS transistor NMOS-11 is provided as a third MOS switch circuit of which the switching operation is performed complementarily to the MOS transistors PMOS-11 and NMOS-12 in each voltage-boosting operation period.

The precharge circuit PRCG-2 has: a buffer amplifier BUF-2 using, as its operation voltage, a combination of the external voltage VSN as one example of the third voltage, and the ground voltage GND; and an n-channel type MOS transistor NMOS-13 as a fourth MOS switch circuit operable to supply its output to the stabilization capacitance connection terminal P3 before the voltage-boosting operation by the charge-pump circuit. The buffer amplifier BUF-2 inverts and outputs a precharge-control signal φPCn. The precharge is directed by a high level of the precharge-control signal φPCn; in the period of the high level, the stabilization capacitance C-2 is precharged by the external voltage VSN output from the buffer amplifier BUF-2 through the MOS transistor PMOS-13.

While not particularly shown in the diagram, the internal voltage VCIN is a voltage produced by the external voltage VSN and the ground voltage GND in a regulator, which satisfies the following condition: VSN≤VCIN≤GND. In the voltage-boosting operation, the one capacitive electrode of the pumping capacitance C-1 is alternately switched between the ground voltage GND and the internal voltage VCIN, whereby the external voltage VSN periodically provided to the other capacitive electrode of the pumping capacitance C-1 is lifted up by the internal voltage VCIN, leading to the voltage boost. The voltage of the one capacitive electrode of the pumping capacitance C-1 is represented by VCM, and the voltage of the other capacitive electrode of the pumping capacitance C-1 is represented by VCP. The boost voltage VGH is a voltage representing the sum of the internal voltage VCIN and the external voltage VSN. The maximum of the internal voltage VCIN is equal to the external voltage VSN and therefore, the boost voltage VGL is double the external voltage VSN at maximum. In this embodiment, the stabilization capacitance connection terminal P3 is precharged by the precharge circuit PRCG-2 to the external voltage VSN before the start of precharge; the boost voltage VGL, ranging up to double the external voltage VSN with respect to the voltage of the stabilization capacitance connection terminal is formed. In the process of the voltage-boosting operation, the gate voltages of the MOS transistors PMOS-11, NMOS-12 and NMOS-11 are changed between the boost voltage VGL and one half thereof, namely the voltage VGL/2 to keep the potential differences between the drain and source, between the gate and source, and between the gate and drain in each of the MOS transistors PMOS-11, NMOS-11 and NMOS-12 from exceeding the external voltage VSN at maximum. According to this arrangement, the withstand voltages of the MOS transistors PMOS-11, NMOS-12 and NMOS-11 may be the same as the withstand voltages (middle withstand voltage) of the MOS transistors PMOS-10 and NMOS-10; and MOS transistors higher in withstand voltage need not be used. The high level of the gate voltages of the MOS transistors PMOS-11, NMOS-12 and NMOS-11 is not limited to the voltage VGL/2, i.e. one half of the boost voltage VGL. It may be larger than one half of the boost voltage VGL on condition that the MOS transistors PMOSD-10 and NMOS-10 still have a relatively large margin in withstand voltage with respect to the external voltage VSN. Further, it may be smaller than one half of the boost voltage VGL on condition that the difference in gate voltage between ON and OFF states in each of the MOS transistors PMOS-11, NMOS-12 and NMOS-11 is small.

More specifically, gate-control signals alternately clock-changed between the internal voltage VCIN and the ground voltage GND are supplied to the gates of the MOS transistors PMOS-10 and NMOS-10 in a voltage-boosting operation period. The MOS transistors PMOS-10 and NMOS-10 each have a withstand voltage (middle withstand voltage) enough to withstand the external voltage VSN. To the gates of the MOS transistors PMOS-11 and NMOS-12, gate-control signals VG-P11 and VG-N12 changed between the boost voltage VGL and one half thereof, i.e. the voltage VGL/2 are provided. The gate of the MOS transistor NMOS-11 is provided with a gate-control signal VG-N11 changed between the boost voltage VGL and one half thereof, i.e. the voltage VGL/2. A voltage at least double as large as the external voltage VSN is applied between terminals of the MOS transistor NMOS-13 of the precharge circuit PRCG-2 and therefore, a high withstand voltage MOS transistor larger, in withstand voltage, than the middle withstand voltage MOS transistors of the charge-pump circuit PMP-2 including the MOS transistor NMOS-12 is adopted therefor. Although no special restriction is intended, the negative boost voltage VGL is supplied to the gate of the MOS transistor NMOS-13 in this embodiment.

No graphical representation is provided concerning the logic for producing the gate-control signals VG-P11, VG-N11 and VG-N12, but FIG. 2 may be used as an alternative by replacing VSP with VSN, VGH with VGL, PMOS-2 with NMOS-11, PMOS-3 with NMOS-12, NMOS-2 with PMOS-11, VG-P3 with VG-N12, VG-N2 with VG-P11, and VG-P2 with VG-N12 when reference is made thereto. The voltage VGL/2, which is one half of the boost voltage VGL, is supplied through a buffer amplifier arranged to use a combination of the ground voltage GND and the external voltage VSN as its power source to the subsequent stage after a resistive potential dividing circuit with a resistance division ratio of ½ halves the boost voltage VGL. The gate-control signal VG-N11 is produced by an inverter buffer arranged to use a combination of the boost voltage VGL and one half thereof, i.e. voltage VGL/2 as its power source, and a level shifter. In a voltage-boosting operation period, the level shifter accepts the input of the clock-changed timing signal VIN1, and level-shifts an input amplitude between the ground voltage GND and the external voltage VSN into a signal amplitude arranged by use of the negative boost voltage VGL, and outputs the resultant signal. The gate-control signals VG-N12 and VG-P11 are formed by an inverter buffer arranged to use a combination of the boost voltage VGL and one half thereof, i.e. the voltage VGL/2 as its power source, and a level shifter. In a voltage-boosting operation period, the level shifter accepts the input of the clock-changed timing signal VIN2, level-shifts an input amplitude between the ground voltage GND and the external voltage VSN into an amplitude arranged by use of the negative boost voltage VCIN, and outputs the resultant signal.

As to the timing of a voltage-boosting operation by the booster 14 of FIG. 4, voltage waveforms of signals other than the timing signal VIN1 become inverted in polarity. The voltage-boosting operation of the boost voltage VGL is started after the precharge in response to the power-on reset as in the same way in the booster of FIG. 1. Although no special restriction is intended, the boost voltage VGL is precharged to the external voltage VSN in this embodiment. In response to the power-on reset, the supply of the external voltage VSN to the stabilization capacitance C-2 through the MOS transistor NMOS-13 is started. Then, the boost voltage VGL is lowered to the level of the external voltage VSN. In the precharge period, the internal node voltage VCP becomes the level of the external voltage VSN as well.

In the voltage-boosting operation period, the MOS transistors NMOS-10 and PMOS-10 are complementarily switched, whereby the internal node voltage VCM is alternately changed between the internal voltage VCIN and the ground voltage GND following the internal voltage VCIN. This change is transmitted through the pumping capacitance C-1 to the internal node voltage VCP. Thus, the internal node voltage VCP is caused to gradually transition to a voltage given by VSN+VCIN while following the change in the internal voltage VCIN with respect to the external voltage VSN. The change is supplied to the stabilization capacitance C-2 through the MOS transistor NMOS-11, and the stabilization capacitance is charged. Then, the boost voltage VGL reaches the voltage VSN+VCIN. The boost voltage VGL is supplied to the internal circuit and utilized for an operating power source of a drive circuit and other uses.

As described above, the boost voltage VGL is charged to the level of the external voltage VSN by the precharge circuit PRCG-2 before the voltage-boosting operation. After that, the boost voltage is made a voltage lower than the external voltage VSN by the voltage-boosting operation, and the gate control of the MOS transistors NMOS-12, PMOS-11 and NMOS-11 is performed between the boost voltage VGL and one half thereof, i.e. the voltage VGL/2. The internal voltage VCIN is a voltage produced from the internal voltage VSN, which is given by VGL=VSN+VCIN (VSN≤VCIN≤0). Therefore, the inter-terminal voltage differences of the MOS transistors NMOS-12, PMOS-11 and NMOS-11 never exceed the external voltage VSN. Hence, the MOS transistors NMOS-12, PMOS-11 and NMOS-11 may be composed of MOS transistors of middle withstand voltages. While high-voltage elements are used in the precharge circuit PRCG-2 and the control logic therefor, these elements are not involved in the output impedance of the boost voltage VGL. In other words, a low impedance as required of the MOS transistors NMOS-12, PMOS-11 and NMOS-11 is not required of them. Therefore, the high-voltage elements may be composed of elements smaller, in transistor size, than the MOS transistors NMOS-12, PMOS-11 and NMOS-11. According to this, the MOS transistors NMOS-12, PMOS-11 and NMOS-11 constituting parts of the voltage-boosting MOS switch circuit can be composed of MOS transistors of middle withstand voltages; the boost voltage VGL can be raised to double the external voltage VSN at maximum; and both of the decrease in output resistance of the boost voltage and the reduction in booster size can be achieved.

FIG. 5 shows a booster according to the third embodiment. The booster 15 shown in the diagram is configured by a booster part 15A arranged in a semiconductor integrated circuit such as a driver IC in an on-chip manner. Although no special restriction is intended, the semiconductor integrated circuit is formed on a semiconductor substrate (semiconductor chip) of monocrystalline silicon or the like by e.g. a known CMOS integrated circuit manufacturing technique. The booster 15 includes a charge-pump circuit PMP-3 and a precharge circuit PRCG-3. The charge-pump circuit PMP-3 includes a charge pump part PMP-3p arranged in the semiconductor integrated circuit in an on-chip manner and as externally-mounted elements of the semiconductor integrated circuit, a pumping capacitance C-1 and a stabilization capacitance C-2.

The booster 15 of FIG. 5 is different from the booster of FIG. 4 in that the precharge circuit PRCG-3 arranged by use of a Schottky diode SKD is adopted instead of the precharge circuit PRCG-2 of FIG. 4. The Schottky diode SKD is externally mounted, of which the cathode is coupled to the external terminal P5 for accepting the external voltage VSN, and the anode is coupled to the stabilization capacitance connection terminal P3. With the Schottky diode SKD, the stabilization capacitance connection terminal P3 can be defined to be an external voltage VSN higher, in level, than a voltage which the negative boost voltage VGL reaches. The Schottky diode precharges the stabilization capacitance connection terminal P3 to the level of the external voltage VSN before the start of the voltage-boosting operation in the same way as the precharge circuit PRCG-2 of FIG. 4 performs. Therefore, both of the decrease in the output resistance of the boost voltage and the reduction in booster size can be achieved. Especially, the negative boost voltage VGL is the lowest voltage in the driver IC and as such, it is often used as a potential of the substrate of the driver IC. The boost voltage VGL is a voltage lower than the external voltage VSN which is an external power source. Therefore, making the node (i.e. the stabilization capacitance connection terminal P3) of the boost voltage VGL the external voltage VSN, it becomes difficult to turn on a parasitic bipolar transistor at the time of starting the voltage-boosting operation, which serves for a countermeasure against the latch-up. In the case of providing the Schottky diode SKD only for a countermeasure against the latch-up, it is not essential to make the arrangement for reducing the withstand voltage of MOS transistors constituting parts of the booster. Such arrangement is what is derived from the first idea that would be found based on the intention of achieving both of the decrease in the output resistance of the boost voltage and the reduction in booster size. Other parts of the structure of the booster are the same as those shown in FIG. 4 and therefore, the detailed descriptions thereof are omitted here.

FIG. 6 shows a booster according to the fourth embodiment. The booster 16 shown in the diagram is configured by a booster part 16A arranged in a semiconductor integrated circuit such as a driver IC in an on-chip manner. Although no special restriction is intended, the semiconductor integrated circuit is formed on a semiconductor substrate (semiconductor chip) of monocrystalline silicon or the like by e.g. a known CMOS integrated circuit manufacturing technique. The booster 16 includes a charge-pump circuit PMP-4 and a precharge circuit PRCG-1. The charge-pump circuit PMP-4 is configured by a charge pump part PMP-4p arranged in a semiconductor integrated circuit in an on-chip manner and externally-mounted elements of the semiconductor integrated circuit, a pumping capacitance C-1 and a stabilization capacitance C-2.

The charge-pump circuit 16 of FIG. 6 is different from the charge-pump circuit 13 of FIG. 1 in that the MOS transistor NMOS-1 constituting part of a first switch circuit is arranged to supply a negative internal voltage VCIN. According to this embodiment, gate-control signals for the MOS transistors PMOS-1 and NMOS-1 are changed between the internal voltages VCIN and VCIP. Other parts of the structure of the booster are the same as those of the booster of FIG. 1 and therefore, the detailed descriptions thereof are omitted here.

The structure of the booster of FIG. 6 is arranged so that the maximum voltage of the boost voltage VGH is independent on the external voltage VSP as far as possible. Specifically, the boost voltage VGH is a voltage given by "VSP+(VCIP−VCIN)", and the withstand voltages of the MOS transistors PMOS-1 and NMOS-1 are a voltage represented by "VCIP−VCIN". Sometimes, there is concern about the decline in the external voltage VSP supplied by a power supply circuit on a system board owing to the increase in power consumption by another circuit mounted on the system board. In the structure of the booster of FIG. 1, in the event of the undesirable decline in the external voltage VSP supplied from the outside, the proportion of the decreases in the external voltage VSP and the internal voltage VCIP produced therefrom in the decrease in the whole boost voltage, provided that the external voltage and the internal voltage are individual elemental voltages forming the boost voltage VGH, is large. In contrast, with the structure of the booster of FIG. 6, in the event of the undesirable decline in the external voltage VSP supplied from the outside, the influence of the decline of the external voltage VSP on the boost voltage VGH can be eased. This is because the decreases in the external voltage VSP and the internal voltage VCIP produced therefrom, which are parts of elemental voltages forming the boost voltage both influence the boost voltage VGH, but the internal voltage VCIN makes an elemental voltage having no influence on the decline in the boost voltage VGH. In other words, the dependence of the boost voltage VGH on the external voltage VSP can be declined. In addition, in the case of a pair of power sources formed by the external voltage VSP on the high-potential side and the external voltage on the low-potential side, the decline in the external voltage VSP on the high-potential side is accompanied by the rise (lift) of the external power source of the other low-potential side and therefore, the decrease of the boost voltage VGH owing to the decreases of the voltages VSP and VCIP can be compensated by the voltage VCIN on the low-potential side.

Hence, according to the structure of FIG. 6, the decrease in the output resistance of the boost voltage VGH, and the reduction in booster size can be both achieved; and the stabilization of the boost voltage VGH against the fluctuation in the external voltage VSP can be enhanced as realized by the booster of FIG. 1.

While not particularly shown in the diagram, the structure of the booster of FIG. 6 can be applied to the structures of the boosters of FIGS. 4 and 5 as well.

Figure 7:
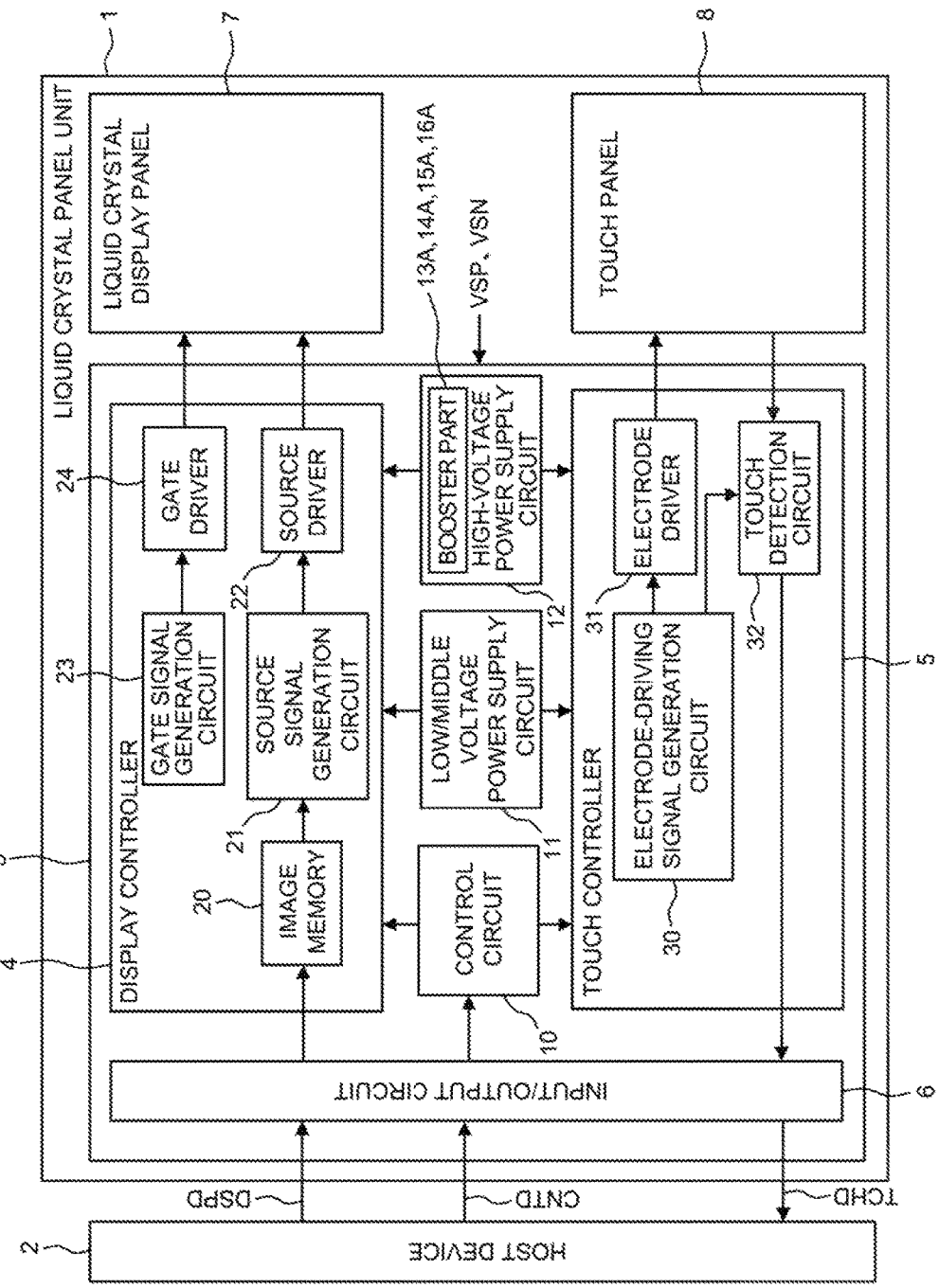
FIG. 7 is a block diagram showing an example of a liquid crystal panel unit as an application of a driver IC with a booster to which the above booster is applied.

FIG. 7 shows, by example, a liquid crystal panel unit to which the booster as described above is applied. In the diagram, the numeral "1" represents a liquid crystal panel unit, and "2" represents a host device. The liquid crystal panel unit 1 has: a liquid crystal display panel 7; a touch panel 8 disposed thereon; and a liquid crystal display driver 3, which is an example of the driver IC.

The host device 2 provides the liquid crystal display driver 3 with display data, display control commands, touch control commands, etc. and acquires touch detection data, a status, etc. from the liquid crystal display driver 3. In an application to e.g. a portable terminal device, the host device 2 includes: a communication part capable of connecting to a mobile communication network or the like; a protocol processor which performs a communication protocol processing by use of the communication part; an application software program processor which has control of the protocol processor, and performs various kinds of data processing control; an auxiliary storage; and other peripheral devices including an external interface circuit. The host device 3 is not limited to such an application. The host device may be arranged for various kinds of electronic devices, each using the liquid crystal panel unit 1.

The liquid crystal display panel 7 includes a plurality of display elements formed like a matrix on a glass substrate; each display element has a data terminal and a common terminal. The display elements have thin film transistors connected in series, and pairs of liquid crystal electrodes with a liquid crystal held therebetween. In each display element, the data terminal is coupled to the source of the thin film transistor, and the common terminal is coupled to one liquid crystal electrode. The pairs of liquid crystal electrodes may form other holding capacitances. The select terminal of each display element is coupled to the gate of the corresponding thin film transistor. To the common terminals of the display elements, a common voltage is provided as a common potential. The select terminals of the display elements are connected to the corresponding gate electrodes; the data terminals of the display elements are connected to the corresponding source electrodes arrayed in a direction crossing the direction of array of the gate electrodes. The lines of the display elements arranged along arrays of the gate electrodes serve as display lines. The thin film transistors of the display elements are turned on in units of display lines, whereby the display lines are selected (scan of the display lines). Gradation drive signals according to display data are provided from the source electrode to the display elements in each display line select period (horizontal display period). The gradation drive signals are voltage signals selected from gradation voltages according to the display data. Since the thin film transistor is turned off, the signal charge of a gradation drive signal put on each display element remains held by a capacitance formed between the liquid crystal electrodes of the liquid crystal to keep the shutter state of the liquid crystal until the next time the display element is selected.

The touch panel 8 has scan electrodes which are scanned and driven sequentially, and detection electrodes arranged to cross the scan electrodes; a given capacitance component (detected capacitance) is formed at each crossing part between the electrodes. In sequentially driving the scan electrodes, an electric charge arising on each detection electrode varies according to the change in electrostatic capacitance depending on whether or not an object (e.g. a finger) is located in the vicinity of the scan electrode being driven. The information concerning the electric charge is integrated for each scan. The charge differences of signals thus integrated will be utilized as touch detection signals.

The liquid crystal display driver 3 includes: an input/output circuit interfaced to the host device 2; a display controller 4; a touch controller 5; a control circuit 10; a low/middle voltage power supply circuit 11; and a high-voltage power supply circuit 12.

The input/output circuit 6 accepts the input of commands CNTD including a display control command and a touch control command from the host device 2, and provides them to the control circuit 10.

The control circuit 10 controls the operation of the liquid crystal display driver 3 based on the input commands CNTD. The display controller 4 stores image data DSPD supplied from the host device 2 in an image memory. When instructed to perform a display operation, the display controller 4 causes the gate signal generation circuit 23 to produce select signals for sequentially selecting the display lines in synchronization with a display timing and in parallel, causes the source signal generation circuit 21 to produce source signals for driving the source lines based on image data in the image memory. The gate driver 24 selects a display line based on a select signal and in synchronization therewith, the source driver 22 drives source lines of the liquid crystal display panel 7 according to source signals. In this way, in the liquid crystal display panel 7, brightness signals are sequentially written in pixels of the display lines for each vertical synchronization period in synchronization with horizontal synchronization periods in units of frames.

The control circuit 10 controls the operation of the touch controller 5 based on the command CNTD input thereto. In synchronization with a display timing, the touch controller 5 causes the electrode drive signal generation circuit 30 to generate drive signals for scan electrodes and detection electrodes, causes the electrode driver 31 to provide an initial potential to the detection electrodes and to drive the scan electrodes, causes the touch detection circuit 32 to integrate, for each detection electrode, a charge signal depending on an electrostatic capacitance in the vicinity of the intersection point of the scan and detection electrodes, accumulates integration data for each scan frame, and provides them to the host device 2 as touch detection data TCHD. Based on the touch detection data TCHD thus provided, the host device 2 determines whether a touch is made or not and calculates touch coordinates for each scan frame for utilization in the subsequent data processing.

The low/middle voltage power supply circuit 11 produces a low-voltage power source for logic use and a middle-voltage power source, and supplies the power sources to the internal circuit. Incidentally, the low-voltage power source is for utilization in e.g. MOS transistor circuits of low withstand voltages; and the middle-voltage power source is for utilization in e.g. MOS transistor circuits of middle withstand voltages.

The high-voltage power supply circuit 12 has a booster part 13A, 14A, 15A or 16A for constituting the booster as described with reference to FIGS. 1 to 6. The high-voltage power supply circuit 12 supplies, as high-voltage power sources, boost voltages VGH and VGL produced by the booster part to the internal circuit. The liquid crystal display driver 3 uses both of the positive boost voltage VGH and the negative boost voltage VGL and therefore, it includes e.g. the booster part 13A or 16A, and the booster part 14A or 15A.

The liquid crystal display driver 3 is composed of a semiconductor integrated circuit formed on one semiconductor substrate (chip), and it enables the achievement of both of the decrease in the output resistance of the boost voltage VGH(VGL) and the reduction in booster size as described above. Therefore, the downsizing of the chip size is achieved as to the liquid crystal display driver 3. The size of the display panel unit can be reduced. This is because the liquid crystal display driver 3 is to be mounted on a frame edge disposed around the display panel.

While the invention made by the inventor has been described above based on the embodiments concretely, the invention is not limited to the embodiment. It is obvious that various changes or modifications thereof may be made without departing from the subject matter thereof.

For instance, the conditions concerning the output impedance of a charge-pump circuit and the chip footprint thereof are the same as those for other driver ICs each including a charge-pump circuit as well as a liquid crystal driver. Therefore, the invention can be applied not only a liquid crystal display driver, but also various kinds of semiconductor integrated circuits.

The charge-pump circuit is not limited to a structure having only one stage of a pumping capacitance, and it may be arranged to have more than one stage of charge pump parts as described above, which are arranged in series. In this case, an output of the charge pump part of one preceding stage may be connected to an input terminal of the stage subsequent thereto, such as VCIP terminal (FIG. 1) or VCIN terminal (FIG. 4).

In addition, the external voltage VSP may be directly supplied to the source of the MOS transistor PMOS-4 (FIG. 1) of the precharge circuit. Likewise, the external voltage VSN may be directly supplied to the source of the MOS transistor NMOS-13 (FIG. 4).

What is claimed is:

1. A booster comprising:
   a charge-pump circuit; and
   a precharge circuit coupled to the charge pump circuit;
   wherein the charge-pump circuit comprises:
      a stabilization capacitance having a capacitive electrode;
      a pumping capacitance having a first capacitive electrode and a second capacitive electrode;
      a first MOS switch circuit configured to alternately supply first and second voltages to the first capacitive electrode of the pumping capacitance;
      a second MOS switch circuit configured to periodically supply a third voltage to the second capacitive electrode of the pumping capacitance; and
      a third MOS switch circuit disposed between the second MOS switch circuit and the capacitive electrode of the stabilization capacitance, wherein the third MOS switch circuit is configured to be switched complementarily to the second MOS switch circuit; and
   wherein the precharge circuit comprises a fourth MOS switch circuit configured to supply the third voltage to the capacitive electrode of the stabilization capacitance before a voltage-boosting operation by the charge-pump circuit, and wherein the stabilization capacitance is configured to be charged to a sum of the second voltage and the third voltage during the voltage-boosting operation.

2. The booster according to claim 1, wherein the first, second and third MOS switch circuits each have a withstand voltage larger than the third voltage and smaller than a voltage representing a sum of the second and third voltages.

3. The booster according to claim 2,
   wherein gate electrodes of the first MOS switch circuit are configured to receive a first switch control signal changed between the first and second voltages,
   wherein gate electrodes of the second and third MOS switch circuits are configured to receive a second switch control signal changed between a fourth voltage at the capacitive electrode of the stabilization capacitance and the third MOS switch circuit, and a fifth voltage of 1/n of the fourth voltage at the capacitive electrode of the stabilization capacitance, wherein n is a natural number of 2 or more,
   wherein the second MOS switch circuit is configured to be turned off by the fourth voltage at the capacitive electrode of the stabilization capacitance, and configured to be turned on by the 1/n-voltage, and
   wherein the third MOS switch circuit is configured to be turned off by the fourth voltage at the capacitive electrode of the stabilization capacitance, and configured to be turned on by the 1/n-voltage.

4. The booster according to claim 3, wherein n=2.

5. The booster according to claim 1,
   wherein the third voltage is supplied from outside the booster,
   wherein the second voltage is based on the third voltage in the booster, and
   wherein the first voltage is a ground voltage.

6. The booster according to claim 1,
   wherein the third voltage is supplied from outside the booster,
   wherein the second voltage is based on the third voltage in the booster, and
   wherein the first voltage is based on a fifth voltage supplied from outside the booster, and differs from the second voltage in polarity.

7. The booster according to claim 1, wherein the second voltage and the third voltage are each a positive voltage,
   wherein the first MOS switch circuit comprises an n-channel type MOS transistor configured to supply a ground voltage to the first capacitive electrode of the pumping capacitance, and a p-channel type MOS transistor configured to supply the second voltage to the first capacitive electrode of the pumping capacitance,
   wherein the second MOS switch circuit comprises a p-channel type MOS transistor and an n-channel type MOS transistor connected in parallel with each other, and
   wherein the third and fourth MOS switch circuits each have p-channel type MOS transistors.

8. The booster according to claim 1,
   wherein the second and third voltages are each a negative voltage,
   wherein the first MOS switch circuit comprises a p-channel type MOS transistor configured to supply a ground voltage to the first capacitive electrode of the pumping capacitance, and an n-channel type MOS transistor configured to supply the second voltage to the first capacitive electrode of the pumping capacitance,
   wherein the second MOS switch circuit comprises a p-channel type MOS transistor and an n-channel type MOS transistor connected in parallel with each other and configured to supply the third voltage, and wherein the third and fourth MOS switch circuits each have n-channel type MOS transistors.

9. The booster according to claim 1,
wherein the first voltage is a negative voltage supplied at least in part from outside the booster,
wherein the second and third voltages are each a positive voltage,
wherein the first MOS switch circuit comprises an n-channel type MOS transistor operable to supply the first voltage to the first capacitive electrode of the pumping capacitance, and a p-channel type MOS transistor configured to supply the second voltage to the first capacitive electrode of the pumping capacitance,
wherein the second MOS switch circuit comprises a p-channel type MOS transistor and an n-channel type MOS transistor are connected in parallel with each other and configured to supply the third voltage, and
wherein the third and fourth MOS switch circuits each have p-channel type MOS transistors.

10. A booster comprising:
a charge-pump circuit; and
a precharge circuit,
wherein the charge-pump circuit comprises:
   a stabilization capacitance;
   a pumping capacitance;
   a first MOS switch circuit operable to alternately supply first and second voltages to a first capacitive electrode of the pumping capacitance;
   a second MOS switch circuit operable to periodically supply a third voltage to a second capacitive electrode of the pumping capacitance; and
   a third MOS switch circuit disposed between the second MOS switch circuit and the stabilization capacitance, wherein the third MOS switch circuit is switched complementarily to the second MOS switch circuit;
wherein the precharge circuit comprises a diode configured to receive the third voltage at a cathode and an anode coupled to a connection node of the stabilization capacitance and the third MOS switch circuit, and
wherein the first, second and third MOS switch circuits each have a withstand voltage larger than the third voltage and smaller than a voltage representing a sum of the second and third voltages.

11. The booster according to claim 10,
wherein gate electrodes of the first MOS switch circuit are configured to receive a first switch control signal changed between the first and second voltages,
wherein gate electrodes of the second and third MOS switch circuits are configured to receive a second switch control signal changed between a fourth voltage of the stabilization capacitance and the third MOS switch circuit, and a fifth voltage of 1/n of the fourth voltage at the connection node, wherein n is a natural number of 2 or more, wherein the second MOS switch circuit is configured to be turned off by the fourth voltage at the connection node, and configured to be turned on by the 1/n-voltage, and
wherein the third MOS switch circuit is configured to be turned off by the fourth voltage at the connection node, and is configured to be turned on by the 1/n-voltage.

12. The booster according to claim 10, wherein the booster is implemented in an integrated circuit.

13. A display driver for a display panel, the display driver comprising:
a charge-pump circuit; and
a precharge circuit coupled to the charge pump circuit,
wherein the charge-pump circuit comprises:
   a stabilization capacitance having a capacitive electrode;
   a pumping capacitance having a first capacitive electrode and a second capacitive electrode;
   a first MOS switch circuit configured to alternately supply first and second voltages to the first capacitive electrode of the pumping capacitance;
   a second MOS switch circuit configured to periodically supply a third voltage to the second capacitive electrode of the pumping capacitance; and
   a third MOS switch circuit disposed between the second MOS switch circuit and the capacitive electrode of the stabilization capacitance, wherein the third MOS switch circuit is configured to be switched complementarily to the second MOS switch circuit;
wherein the precharge circuit comprises a diode configured to receive the third voltage at a cathode and an anode of the diode coupled to the capacitive electrode of the stabilization capacitance and the third MOS switch circuit, and
wherein the first, second and third MOS switch circuits each have a withstand voltage larger than the third voltage and smaller than a voltage representing a sum of the second and third voltages.

14. The display driver according to claim 13, wherein a gate electrode of the first MOS switch circuit is configured to receive a first switch control signal changed between the first and second voltages,
wherein a gate electrode of the second MOS switch and a gate electrode of the third MOS switch circuits are configured to receive a second switch control signal changed between a fourth voltage at the capacitive electrode of the stabilization capacitance and the third MOS switch circuit, and a fifth voltage of 1/n of the fourth voltage at the capacitive electrode of the stabilization capacitance, wherein n is a natural number of 2 or more;
wherein the second MOS switch circuit is configured to be turned off by the fourth voltage at the capacitive electrode of the stabilization capacitance and turned on by the 1/n-voltage, and
wherein the third MOS switch circuit is configured to be turned off by the fourth voltage at the capacitive electrode of the stabilization capacitance, and turned on by the 1/n-voltage.

15. The display driver to claim 14, wherein n=2.

16. The display driver to claim 13, wherein the diode is configured to supply the third voltage to the capacitive electrode of the stabilization capacitance, the diode comprising a cathode connected to a third voltage-supply terminal configured to receive the third voltage from outside the display driver, and the anode connected to the capacitive electrode of the stabilization capacitance.

17. A method for boosting a voltage using a booster circuit and a precharge circuit, comprising:
alternately supplying, by a first MOS switch circuit of the booster circuit, first and second voltages to a first capacitive electrode of a pumping capacitance of the booster circuit;
periodically supplying, by a second MOS switch circuit of the booster circuit, a third voltage to a second capacitive electrode of the pumping capacitance;
switching complementarily, by a third MOS switch circuit of the booster circuit disposed between the second MOS switch circuit and a capacitive electrode of a stabilization capacitance of the booster circuit, to the second MOS switch circuit; and supplying, by a fourth MOS switch circuit of the precharge circuit, the third voltage to the capacitive electrode of the stabilization capacitance before a voltage-boosting operation by the booster circuit, wherein the stabilization capacitance is configured to be charged to a sum of the second voltage and the third voltage during the voltage-boosting operation.

18. The method of claim 17, wherein the first MOS switch circuit comprises a p-channel type MOS transistor and further comprising:

supplying, by the first MOS switch circuit, the first voltage to the first capacitive electrode of the pumping capacitance; and supplying, by the p-channel type MOS transistor, the second voltage to the first capacitive electrode of the pumping capacitance.

\* \* \* \* \*

UNITED STATES PATENT AND TRADEMARK OFFICE
CERTIFICATE OF CORRECTION

PATENT NO. : 10,135,444 B2  
APPLICATION NO. : 15/333709  
DATED : November 20, 2018  
INVENTOR(S) : Yutaka Saeki Page 1 of 1

It is certified that error appears in the above-identified patent and that said Letters Patent is hereby corrected as shown below:

In the Claims

In Column 24, Line 48, Claim 15, after "driver" insert -- according --.

In Column 24, Line 49, Claim 16, after "driver" insert -- according --.

Signed and Sealed this
Twenty-first Day of April, 2020

Andrei Iancu
*Director of the United States Patent and Trademark Office*